United States Patent
Myung et al.

(10) Patent No.: US 8,970,042 B2
(45) Date of Patent: Mar. 3, 2015

(54) CIRCUIT BOARD, COMPRISING A CORE INSULATION FILM

(71) Applicant: Samsung Electronics Co., Ltd., Gyeonggi-do (KR)

(72) Inventors: Bok-Sik Myung, Seoul (KR); Chul-Woo Kim, Incheon (KR); Kyung-Tae Na, Gyeonggi-do (KR); Young-Bae Kim, Gyeonggi-do (KR); Yong-Hoon Kim, Gyeonggi-do (KR); Hee-Seok Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/674,331

(22) Filed: Nov. 12, 2012

(65) Prior Publication Data
US 2013/0200531 A1    Aug. 8, 2013

(30) Foreign Application Priority Data

Feb. 2, 2012    (KR) .................. 10-2012-0010867

(51) Int. Cl.
*H05K 1/02*    (2006.01)
*H01L 23/28*    (2006.01)
(Continued)

(52) U.S. Cl.
CPC .............. *H05K 1/0298* (2013.01); *H01L 23/28* (2013.01); *H05K 1/02* (2013.01); *H05K 3/4602* (2013.01); *H01L 23/49816* (2013.01); *H01L 23/49822* (2013.01); *H01L 23/49827* (2013.01); *H01L 25/105* (2013.01); *H01L 23/3128* (2013.01); *H05K 3/4644* (2013.01); *H05K 2201/0191* (2013.01); *H05K 2201/09136* (2013.01); *H01L 2224/48091* (2013.01);

(Continued)

(58) Field of Classification Search
USPC ................ 257/773, 774, 668, 778, 738, 734, 257/E23.021, 737; 174/258, 262, 250, 251; 361/763
See application file for complete search history.

(56) References Cited

U.S. PATENT DOCUMENTS

| | | | | |
|---|---|---|---|---|
| 8,466,554 B2 * | 6/2013 | Park et al. | ..................... | 257/738 |
| 2008/0023815 A1 * | 1/2008 | Asai et al. | ..................... | 257/687 |

(Continued)

FOREIGN PATENT DOCUMENTS

| | | |
|---|---|---|
| JP | 2006-186059 | 7/2006 |
| JP | 2010-028028 | 2/2010 |

(Continued)

*Primary Examiner* — Alexander Oscar Williams
(74) *Attorney, Agent, or Firm* — Myers Bigel Sibley & Sajovec, PA (57) ABSTRACT

A circuit board is provided including a core insulation film having a thickness and including a first surface and an opposite second surface, an upper stack structure and a lower stack structure. The upper stack structure has a thickness and has an upper conductive pattern having a thickness and an overlying upper insulation film stacked on the first surface of the core insulation film. The lower stack structure has a thickness and has a lower conductive pattern having a thickness and an overlying lower insulation film stacked on the second surface of the core insulation film. A ratio P of a sum of the thicknesses of the upper conductive pattern and the lower conductive pattern to a sum of the thicknesses of the core insulation film, the upper stack structure and the lower stack structure is in a range from about 0.05 to about 0.2.

18 Claims, 7 Drawing Sheets

(51) Int. Cl.
*H05K 3/46* (2006.01)
*H01L 23/498* (2006.01)
*H01L 25/10* (2006.01)
*H01L 23/31* (2006.01)
*H01L 23/00* (2006.01)

(52) U.S. Cl.
CPC ............... *H01L 2224/16225* (2013.01); *H01L 2224/32145* (2013.01); *H01L 2924/15311* (2013.01); *H01L 2225/1088* (2013.01); *H01L 24/13* (2013.01); *H01L 24/16* (2013.01); *H01L 24/32* (2013.01); *H01L 24/73* (2013.01); *H01L 2224/131* (2013.01); *H01L 2224/48227* (2013.01); *H01L 2224/73265* (2013.01); *H01L 2225/0651* (2013.01); *H01L 2225/1023* (2013.01); *H01L 2225/1058* (2013.01); *H01L 2924/1431* (2013.01); *H01L 2924/1434* (2013.01); *H01L 2924/15331* (2013.01); *H01L 2924/18161* (2013.01); *H01L 2225/06568* (2013.01)
USPC ............ 257/773; 257/E23.021; 257/778; 257/774; 257/668; 257/738; 257/737; 257/734; 174/258; 174/262; 174/250; 174/251

(56) References Cited

U.S. PATENT DOCUMENTS

| | | | | |
|---|---|---|---|---|
| 2008/0283282 | A1* | 11/2008 | Kawasaki et al. | 174/258 |
| 2009/0229873 | A1* | 9/2009 | Yokomaku | 174/261 |
| 2010/0065318 | A1* | 3/2010 | Nagasawa et al. | 174/260 |
| 2010/0259910 | A1* | 10/2010 | Hayashi et al. | 361/783 |
| 2011/0063811 | A1* | 3/2011 | Kariya et al. | 361/761 |
| 2011/0073358 | A1* | 3/2011 | Hayashi | 174/258 |
| 2011/0192637 | A1* | 8/2011 | Asai et al. | 174/255 |
| 2011/0209905 | A1* | 9/2011 | Morita et al. | 174/257 |
| 2011/0209911 | A1* | 9/2011 | Ishida et al. | 174/264 |
| 2011/0247208 | A1* | 10/2011 | Ikeda et al. | 29/830 |
| 2012/0085572 | A1* | 4/2012 | Sakai | 174/258 |
| 2013/0192879 | A1* | 8/2013 | Morita et al. | 174/251 |
| 2013/0256018 | A1* | 10/2013 | Hayashi | 174/258 |
| 2013/0284506 | A1* | 10/2013 | Zanma et al. | 174/260 |
| 2014/0014399 | A1* | 1/2014 | Kariya et al. | 174/250 |
| 2014/0027165 | A1* | 1/2014 | Morita et al. | 174/258 |
| 2014/0054068 | A1* | 2/2014 | Kato et al. | 174/251 |
| 2014/0145317 | A1* | 5/2014 | Nakamura et al. | 257/669 |

FOREIGN PATENT DOCUMENTS

| | | |
|---|---|---|
| JP | 2010-232590 | 10/2010 |
| JP | 2002-198650 A * | 7/2012 |

* cited by examiner

CIRCUIT BOARD, COMPRISING A CORE INSULATION FILM

CROSS-REFERENCE TO RELATED APPLICATION

This application claims priority from Korean Patent Application No. 10-2012-0010867 filed on Feb. 2, 2012 in the Korean Intellectual Property Office, and all the benefits accruing therefrom under 35 U.S.C. 119, the contents of which in its entirety are herein incorporated by reference.

BACKGROUND

The present invention relates to circuit boards, methods for fabricating the same and semiconductor packages using the same.

Recently, as electronic products using a semiconductor package are being made more compact and slim, the semiconductor package used in such products are also becoming smaller and slimmer. Based on to the slimness of the semiconductor package, warpage may occur to the semiconductor package. As characteristics of a semiconductor device are considerably affected by the warpage, various studies are being conducted to reduce or eliminate the warpage of the semiconductor package.

In order to incorporate greater functionality to a single semiconductor package, a package-on-package (POP) structure is often employed. However, the POP package structure is generally problematic because it is difficult to solve a warpage problem of such a semiconductor package as a thickness of the semiconductor package is reduced.

SUMMARY

Embodiments of the present invention provide a circuit board including a core insulation film having a thickness and including a first surface and an opposite second surface, an upper stack structure and a lower stack structure. The upper stack structure has a thickness and has an upper conductive pattern having a thickness and an overlying upper insulation film stacked on the first surface of the core insulation film. The lower stack structure has a thickness and has a lower conductive pattern having a thickness and an overlying lower insulation film stacked on the second surface of the core insulation film. A ratio P of a sum of the thicknesses of the upper conductive pattern and the lower conductive pattern to a sum of the thicknesses of the core insulation film, the upper stack structure and the lower stack structure is in a range from about 0.05 to about 0.25.

In other embodiments, the upper conductive pattern and the upper insulation film include a plurality of layers sequentially and repeatedly stacked on the first surface and the lower conductive pattern. The lower insulation film and the lower conductive pattern include a plurality of layers sequentially and repeatedly stacked on the second surface. The ratio P is in a range from about 0.1 to about 0.25 and a ratio of the thickness of the core insulation film to the sum of the thicknesses of the core insulation film, the upper stack structure and the lower stack structure is in a range from about 0.5 to about 0.75. The thickness of the upper conductive pattern may be substantially the same as the thickness of the lower conductive pattern. A thickness of each of the layers of the upper conductive pattern and a thickness of each of the layers of the lower conductive pattern may be substantially the same.

In further embodiments, a ratio of a sum of thicknesses of the upper insulation film layers, lower insulation layers and the core insulation film to the a sum of the thicknesses of the core insulation film, the upper stack structure and the lower stack structure is in a range from about 0.75 to about 0.9. A ratio of a sum of thicknesses of the upper insulation film layers and the lower insulation layers to the a sum of the thicknesses of the core insulation film, the upper stack structure and the lower stack structure may be in a range from about 0.15 to about 0.25. The thickness of the circuit board may be between 50 μm and 370 μm.

In other embodiments, a semiconductor package includes the circuit board as described above and further includes a semiconductor chip disposed on the circuit board and a molding member surrounding the semiconductor chip. A thickness of the molding member may be between 10 μm and 150 μm and a thickness of the semiconductor chip may be between 10 μm and 90 μm. The semiconductor chip may be connected to the circuit board by flip chip bonding. A top surface of the semiconductor chip may exposed from the molding member.

In yet further embodiments, the semiconductor package further includes an upper substrate disposed on the molding member to be connected to the circuit board. An upper semiconductor chip is disposed on the upper substrate. An upper semiconductor package including an upper molding member surrounds the upper semiconductor chip.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE EMBODIMENTS

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As such, the terms "comprising," "having," "including," and "containing" are to be construed as open-ended terms (i.e., meaning "including, but not limited to,") unless otherwise noted.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein It will be understood that, in order to address the warpage problem of a semiconductor package, such as a POP package, it may be necessary to prevent or minimize a global coefficient of thermal expansion (CTE) between a semiconductor chip and a circuit board. To this end, the circuit board should have a low CTE.

Hereinafter, a circuit board according to a some embodiments of the present invention will be described with reference to FIGS. 1 and 2.

Figure 1:
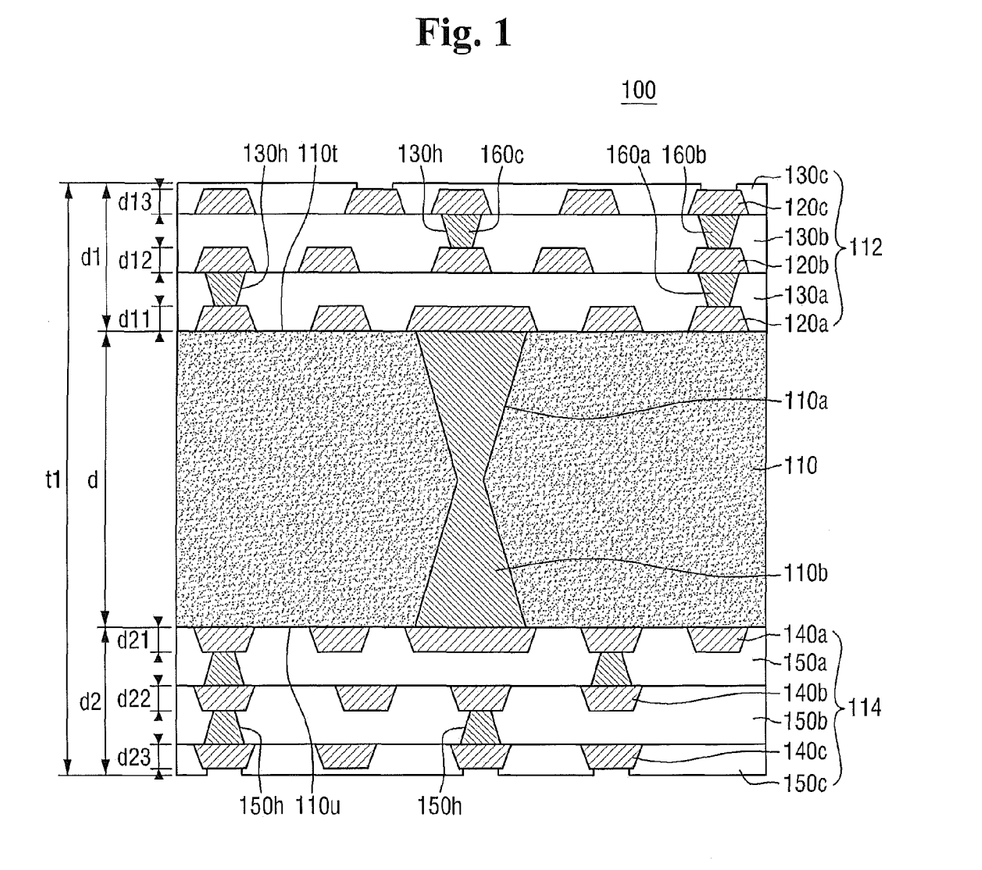
FIG. 1 is a cross sectional schematic diagram of a circuit board according to some embodiments of the present invention.
Figure 2:
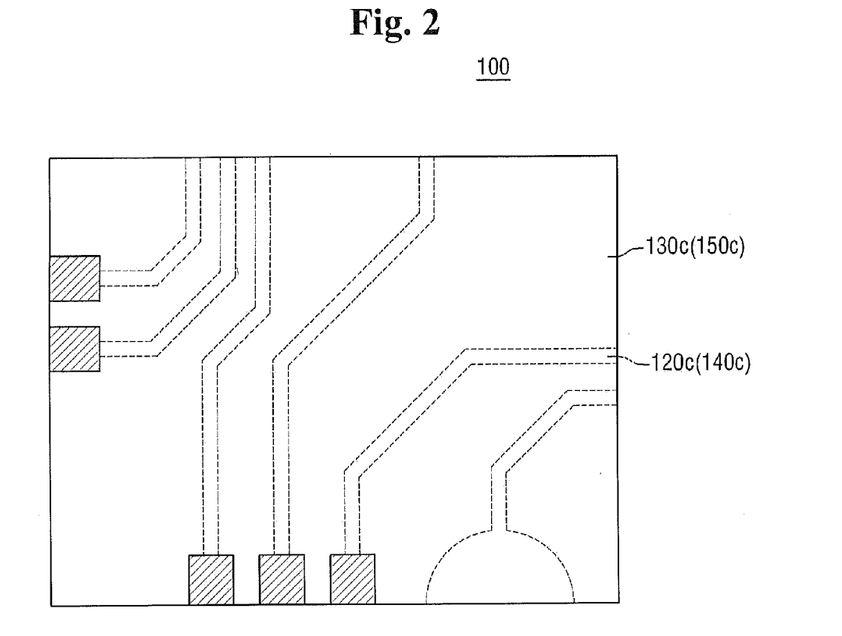
FIG. 2 is a plan view schematic diagram of the circuit board shown in FIG. 1.

FIG. 1 is a schematic diagram of a circuit board according to some embodiments of the present invention and FIG. 2 is a schematic plan view of the circuit board shown in FIG. 1.

The circuit board 100 may include, but is not limited to, a printed circuit board (PCB), a flexible PCB, or a flexible rigid PCB (FRPCB). The circuit board 100 may be used in a package substrate, a substrate for a multi-chip module or a general mother board, but not limited thereto. However, for the sake of convenient explanation, the following description will be made with regard to a package substrate.

Referring to FIG. 1, as illustrated, the circuit board 100 includes a core insulation film 110, an upper stack structure 112 and a lower stack structure 114. The upper stack structure 112 includes upper conductive patterns 120a, 120b and 120c and upper insulation films 130a, 130b and 130c repeatedly stacked in sequence. The lower stack structure 114 also includes lower conductive patterns 140a, 140b and 140c and lower insulation films 150a, 150b and 150c repeatedly stacked in sequence.

The core insulation film 110 includes a first surface 110t and a second surface 110u on opposite sides thereof. The upper stack structure 112 is stacked on the first surface 110t of the core insulation film 110, and the lower stack structure 114 is stacked on the second surface 110u of the core insulation film 110. A core insulation film via hole 110a for connecting the first surface 110t with the second surface 110u is formed in the core insulation film 110. The core insulation film via hole 110a may be formed by, for example, by laser drilling. The core insulation film via hole 110a may be filled, for example, with a conductive material to form a core insulation film via 110b in the via hole 110a. The core insulation film via 110b may be formed of a material including, for example, copper (Cu). The upper conductive patterns 120a, 120b and 120c formed on the first surface 110t of the core insulation film 110 and the lower conductive patterns 140a, 140b and 140c formed on the second surface 110u of the core insulation film 110 are selectively electrically connected through the core insulation film via 110b.

The core insulation film 110 used for the circuit board 100 may have highly stable numerical values (dimensions), heat resistance, chemical resistance and inflammability. In addition, in order to form a conductive pattern and the core insulation film via 110b on the core insulation film 110, the core insulation film 110 generally needs to have a good plating characteristic. Therefore, the core insulation film 110 may be formed of a material including, for example, glass filler or ceramic powder in an epoxy-based resin.

Referring to FIG. 1, the upper stack structure 112 has the first upper conductive pattern 120a, the first upper insulation film 130a, the second upper conductive pattern 120b, the second upper insulation film 130b, the third upper conductive pattern 120c and the third upper insulation film 130c, stacked in sequence on the first surface 110t of the core insulation film 110. In some embodiments, the third upper insulation film 130c positioned at the topmost layer of the upper stack structure 112 may be formed of a material different from the first upper insulation film 130a and the second upper insulation film 130b, but is not limited thereto. The first and second upper insulation films 130a and 130b may be formed of, for example, prepreg having an epoxy resin or acrylate impregnated in a mesh-type reinforce fiber. However, the third upper insulation film 130c may be formed of, for example, epoxy resin based photo solder resist. The first upper insulation film 130a and the second upper insulation film 130b may include a plurality of upper via holes 130h. The upper via holes 130h may be filled with a conductive material to form upper vias 160a, 160b and 160c. The upper vias 160a, 160b and 160c selectively electrically connect upper conductive patterns positioned on and beneath the first and second upper insulation films 130a and 130b. In addition, the first upper conductive pattern 120a may or may not be not electrically connected to the core insulation film via 110b. The upper vias 160a, 160b and 160c and the upper conductive patterns 120a, 120b and 120c may be formed of, for example, copper (Cu), aluminum (Al), silver (Ag), gold (Au), nickel (Ni) or a material including copper (Cu).

The upper vias 160a, 160b and 160c may include a basic via 160c simply connecting the upper conductive patterns 120a, 120b and 120c, and a stack via. Here, the stack via means a via formed on another via. In FIG. 1, an upper via 160b may be formed on a lower via 160a, and the upper via 160b and the lower via 160a are referred to as a stack via. In detail, the upper stack structure 112 includes the first upper conductive pattern 120a on the first surface 110t of the core insulation film 110, the first upper insulation film 130a formed on the first upper conductive pattern 120a, the second upper conductive pattern 120b formed on the first upper insulation film 130a, and the stack via 160a for connecting the first upper conductive pattern 120a with the second upper conductive pattern 120b.

Referring to FIG. 2, the third upper conductive pattern 120c is covered by the third upper insulation film 130c, excluding some terminals that may be connected to semiconductor chips. That is to say, only a portion of the third upper conductive pattern 120c is exposed to the outside of the circuit board 100.

Referring to FIG. 1, the lower stack structure 114 includes the first lower conductive pattern 140a, the first lower insulation film 150a, the second lower conductive pattern 140b, the second lower insulation film 150b, the third lower conductive pattern 140c and the third lower insulation film 150c sequentially stacked on the second surface 110u of the core insulation film. The first lower conductive pattern 140a is electrically connected to the first upper conductive pattern 120a through the core insulation film via 110b. As the lower conductive patterns 140a, 140b and 140c, the lower insulation films 150a, 150b and 150c, and the lower via 160a, which constitute the lower stack structure 114, are substantially the same as described above in describing the upper stack structure 112, repeated descriptions thereof will be omitted.

Referring to FIG. 1, a thickness t1 of the circuit board 100 corresponds to a sum of a thickness d1 of the upper stack structure 112, a thickness d2 of the lower stack structure 114 and a thickness d (A) of the core insulation film 110. The thickness d1 (B) of the upper stack structure 112 corresponds to a sum of thicknesses d11, d12 and d13 of the upper conductive patterns 120a, 120b and 120c and thicknesses of the upper insulation films 130a, 130b and 130c. The thickness d2 (C) of the lower stack structure 114 corresponds to a sum of thicknesses d21, d22 and d23 of the lower conductive patterns 140a, 140b and 140c and the thicknesses of the lower insulation films 150a, 150b and 150c. Here, a thickness of a conductive pattern means between a bottom surface and a top surface of the conductive pattern. In detail, the thickness d11 of the first upper conductive pattern 120a corresponds to a distance between a contact point of the first upper conductive pattern 120a and the core insulation film 110 and a top surface of the first upper conductive pattern 120a. A thickness of an insulation film pattern means a shortest distance between conductive patterns positioned on and beneath the insulation film pattern or a between each of the conductive patterns and the top surface of the circuit board 100. In detail, the thickness of the first upper insulation film 130a corresponds to a shortest distance between the first upper conductive pattern 120a and the second upper conductive pattern 120b, and the thickness of the third upper insulation film 130c corresponds to a distance between the third upper conductive pattern 120c and the top surface of the circuit board 100.

The thicknesses of the respective conductive patterns and the thicknesses of the respective insulation films may be substantially equal to each other. For example, the thickness d11 ranging from the first surface 110t of the core insulation film 110 to the first upper conductive pattern 120a may be constant. Here, the phrase "constant thickness" means that thicknesses measured at two or more points for comparison are completely equal to each other and to encompass a thickness difference generated due to a processing margin.

Referring to FIG. 1, a ratio P of the sum of the thicknesses d11, d12 and d13 of the upper conductive patterns 120a, 120b and 120c and the thicknesses d21, d22 and d23 of the lower conductive patterns 140a, 140b and 140c to the thickness t1 of the circuit board 100 in some embodiments is in a range of 0.1 to 0.25. In addition, a ratio of the thickness d of the core insulation film 110 to the sum (A+B+C) in some embodiments is in a range of 0.5 to 0.75.

Therefore, a ratio of a sum of the thicknesses of the upper insulation films 130a, 130b and 130c and the thicknesses of the lower insulation films 150a, 150b and 150c to the thickness t1 of the circuit board 100 in some embodiments is in a range of 0.15 to 0.25. Here, the phrase "ratio of X to Y" means a value obtained by dividing X by Y. In addition, a ratio of a thickness of each layer to the thickness t1 of the circuit board 100 means that it is completely equal to the obtained value but should be interpreted to allow for and encompass a thickness difference generated due to a processing margin or the like.

The ratios described above are provided only for illustrating the circuit board according to some embodiments of the present invention but aspects of the present invention are not limited thereto. Along with the development of processing technology, as it has become possible to make a conductive pattern thinner, a lower limit of the P may be smaller than 0.1 in some embodiments. For example, the lower limit of the P may be 0.05 or less.

A thickness of an insulation film included in the circuit board 100 corresponds to a sum of the thickness d of the core insulation film 110, the thicknesses of the upper insulation films 130a, 130b and 130c and the thicknesses of the lower insulation films 150a, 150b and 150c. In the circuit board 100 according to some embodiments of the present invention, a ratio of the thickness of the insulation film to the thickness t1 of the circuit board 100 is in a range of 0.75 to 0.9. In addition, a ratio of a thickness of a conductive pattern, corresponding to a sum of the thicknesses d11, d12 and d13 of the upper conductive patterns 120a, 120b and 120c and the thicknesses d21, d22 and d23 of the lower conductive patterns 140a, 140b and 140c, to the thickness t1 of the circuit board 100 in some embodiments is in a range of 0.1 to 0.25. Therefore, the thickness of the insulation film, that is, the sum of the thickness d of the core insulation film 110, the thicknesses of the upper insulation films 130a, 130b and 130c and the thicknesses of the lower insulation films 150a, 150b and 150c, is 3 to 9 times the thickness of the conductive pattern in some embodiments.

Referring to FIG. 1, the upper stack structure 112 has the upper conductive patterns 120a, 120b and 120c and the upper insulation films 130a, 130b and 130c stacked in that order repeatedly three times. The lower stack structure 114 has the lower conductive patterns 140a, 140b and 140c and the lower insulation films 150a, 150b and 150c stacked in that order repeatedly three times. In the circuit board 100 according to some embodiments of the present invention, a number of stacks in the upper stack structure 112 is equal to that of the stacks in the lower stack structure 114, but aspects of the present invention are not limited thereto. The number of stacks in the upper stack structure 112 may be different from that of stacks in the lower stack structure 114. In addition, the number of stacks may be greater than or less than three times according to the kind of semiconductor chip mounted on the circuit board 100.

Referring to FIG. 1, the thickness d11, d12 and d13 of the upper conductive patterns 120a, 120b and 120c may be equal to the thicknesses d21, d22 and d23 of the lower conductive patterns 130a, 130b and 130c. In addition, the thickness d11, d12 and d13 of the upper conductive patterns 120a, 120b and 120c are equal to each other, and the thicknesses d21, d22 and d23 of the lower conductive patterns 140a, 140b and 140c are also equal to each other. That is to say, in the circuit board 100 according to some embodiments of the present invention, the thickness d11, d12 and d13 of the first to third upper conductive patterns 120a, 120b and 120c and the thicknesses d21, d22 and d23 of the lower conductive patterns 140a, 140b and 140c are all equal to one another. However, the first upper conductive pattern 120a, the second upper conductive pattern 120b and the third upper conductive pattern 120c, which constitute the upper conductive patterns, may have different thicknesses. In addition, for example, the first to third upper conductive patterns 120a, 120b and 120c, which constitute the upper conductive patterns, may have the same thickness, and the first to third lower conductive patterns 140a, 140b and 140c, which constitute the lower conductive patterns, may have the same thickness. However, the thickness d11 of the first upper conductive pattern 120a may be different from the thickness d21 of the first lower conductive pattern 140a. Here, the phrase "same thickness" means that thicknesses measured at two or more points for comparison are completely equal to each other allowing, however, for and encompassing a thickness difference generated due to a processing margin or the like.

In the circuit board 100 according to some embodiments of the present invention, the thickness t1 of the circuit board may be between 50 μm and 370 μm. Recently, as electronic devices using a semiconductor package have become thinner, it is generally necessary to reduce a thickness of the semiconductor package. The thickness of the semiconductor package can be reduced by reducing the thickness t1 of the circuit board 100, which may affect the thickness of the semiconductor package.

Effects will now be described, which may be induced by increasing a ratio of a thickness of a core insulation film to a thickness of a circuit board while reducing a ratio of a sum of thicknesses of conductive patterns to the thickness of the circuit board.

Figure 3:
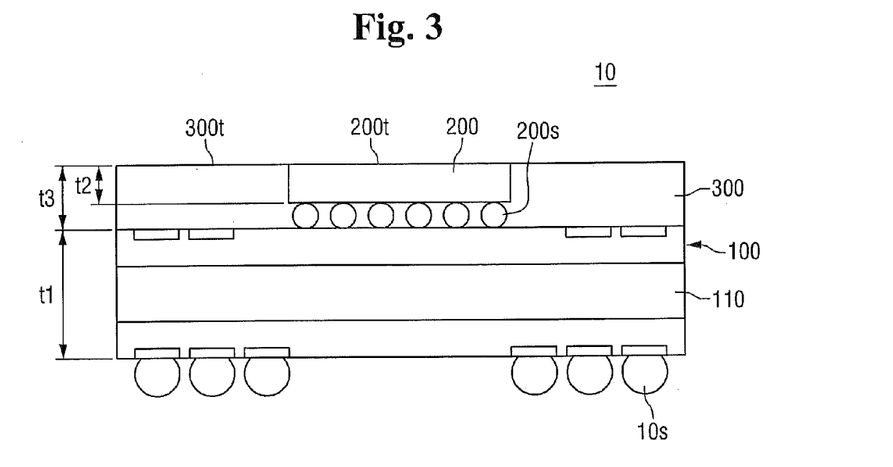
FIG. 3 is a cross sectional schematic diagram of a semiconductor package according to further embodiments of the present invention.
Figure 4:
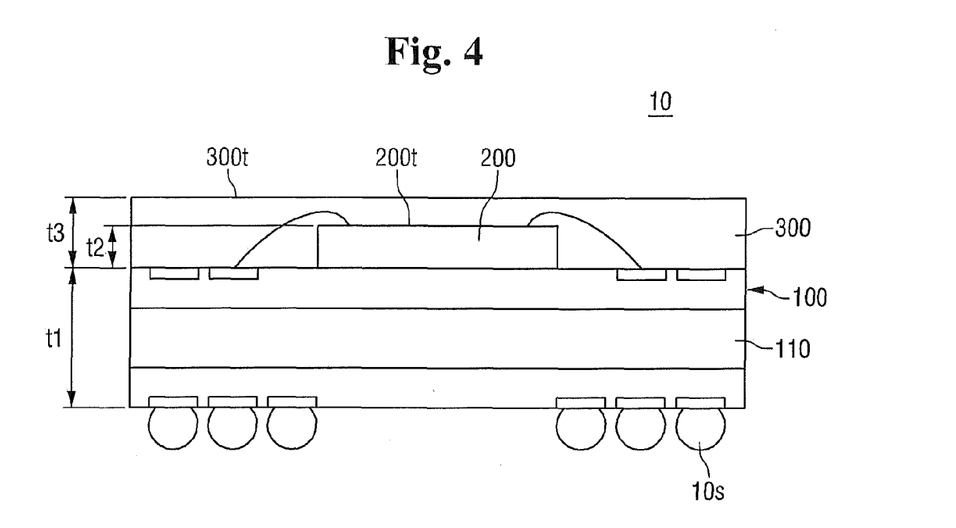
FIG. 4 is a cross sectional schematic diagram that illustrates a modified example of the semiconductor package shown in FIG. 3.
Figure 5:
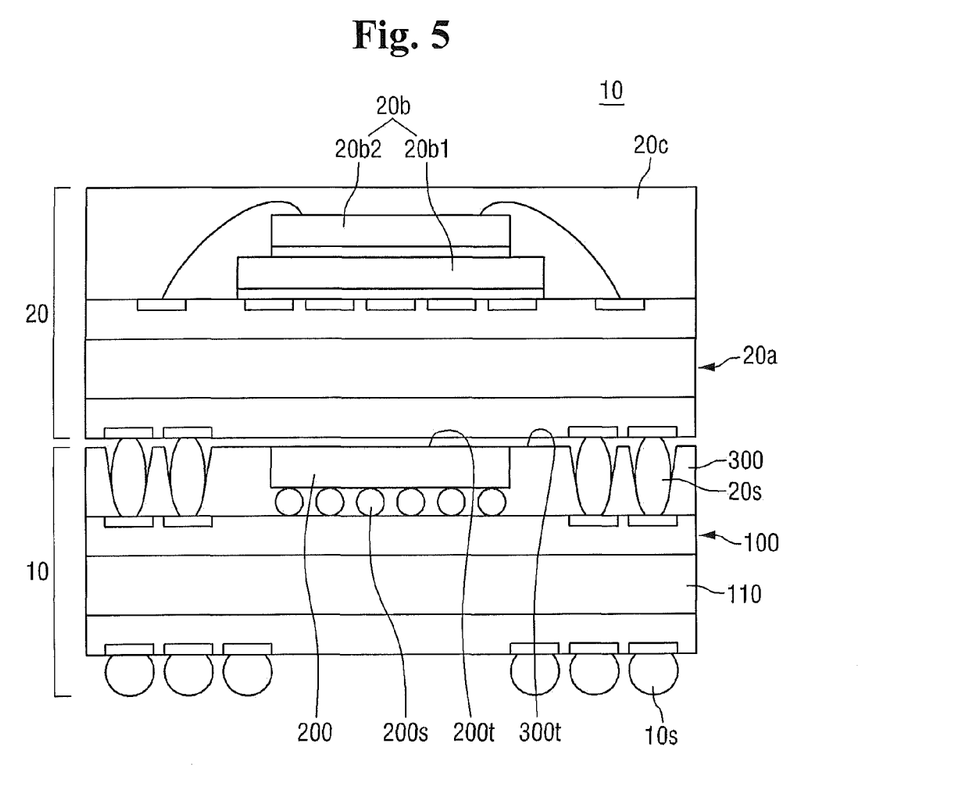
FIG. 5 is a cross sectional schematic diagram that illustrates a package-on-package (POP) structure using the semiconductor package shown in FIG. 3.

A semiconductor package according to further embodiment of the present invention will now be described with reference to FIGS. 1 and 3 to 5. FIG. 3 is a schematic diagram of a semiconductor package according to other embodiments of the present invention, FIG. 4 illustrates a modified example of the semiconductor package shown in FIG. 3 and FIG. 5 illustrates a package-on-package (POP) structure using the semiconductor package shown in FIG. 3.

Referring to FIGS. 1 and 3, the semiconductor package 10 includes a circuit board 100, a semiconductor chip 200 and a molding member 300. The semiconductor chip 200 is disposed on one surface of the circuit board 100. A plurality of external terminals 10 s may be attached to the other surface of the circuit board 100 facing (opposite) the surface on which the semiconductor chip 200 is disposed. The molding member 300 surrounds the one surface of the circuit board 100 and the semiconductor chip 200.

As shown in FIG. 1, the circuit board 100 includes a core insulation film 110, an upper stack structure 112 and a lower stack structure 114. The core insulation film 110 includes a first surface 110t and a second surface 110u facing each other. The upper stack structure 112 has upper conductive patterns 120a, 120b and 120c and upper insulation films 130a, 130b and 130c in that order repeatedly stacked on the first surface 110t of the core insulation film 110. The lower stack structure 114 has lower conductive patterns 140a, 140b and 140c and lower insulation films 150a, 150b and 150c in that order repeatedly stacked on the second surface 110u of the core insulation film 110. In addition, the circuit board used in the semiconductor package according to an embodiment of the present invention satisfies the following conditions. First, a ratio of a sum of thicknesses d11, d12 and d13 of the upper conductive patterns 120a, 120b and 120c and thicknesses d21, d22 and d23 of the lower conductive patterns 140a, 140b and 140c to a thickness t1 of the circuit board 100 is in a range of 0.1 to 0.25. In addition, a ratio of a thickness d of the core insulation film to a thickness t1 of the circuit board 100 is in a range of 0.5 to 0.75.

In the circuit board 100, the thicknesses d11, d12 and d13 of the upper conductive patterns 120a, 120b and 120c may be equal to the thicknesses d21, d22 and d23 of the lower conductive patterns 140a, 140b and 140c. That is to say, the thicknesses d11, d12 and d13 of the first to third upper conductive patterns 120a, 120b and 120c may be equal to the thicknesses d21, d22 and d23 of the first to third lower conductive patterns 140a, 140b and 140c. Here, the term "equal thickness" means two or more thicknesses compared are completely equal to each other allowing, however, for and encompassing a thickness difference generated due to a processing margin, which is provided only for explaining a semiconductor package according to some embodiment of the present invention, but aspects of the present invention are not limited thereto. That is to say, the thicknesses d11, d12 and d13 of the first to third upper conductive patterns 120a, 120b and 120c and the thicknesses d21, d22 and d23 of the first to third lower conductive patterns 140a, 140b and 140c may be all different from one another. Some of the thicknesses d11, d12 and d13 of the first to third upper conductive patterns 120a, 120b and 120c and the thicknesses d21, d22 and d23 of the first to third lower conductive patterns 140a, 140b and 140c may be equal to each other and the others may be different from each other.

The upper conductive patterns 120a, 120b and 120c of the upper stack structure 112 may be connected to each other through a via. The lower conductive patterns 140a, 140b and 140c of the lower stack structure 114 may be connected to each other through a via. The vias include a simple via that simply connects the respective conductive patterns, and a stack via configured such that a via is formed on another via. In detail, the upper stack structure 112 includes the first upper conductive pattern 120a formed on the first surface 110t of the core insulation film 110, the first upper insulation film 130a formed on the first upper conductive pattern 120a, the second upper conductive pattern 120b formed on the first upper insulation film 130a, and a stack via 160a connecting the first upper conductive pattern 120a to the second upper conductive pattern 120b. The above-described structure may also be applied to the lower stack structure 114.

Referring to FIG. 3, the semiconductor chip 200 may be, for example, a memory chip, a logic chip, or the like. Although FIG. 3 shows that one semiconductor chip 200 is disposed on the circuit board 100, a plurality of semiconductor chips may be stacked on the circuit board 100. A top surface 200t of the semiconductor chip 200 may be exposed from the molding member 300. The semiconductor chip 200 may be electrically connected to the circuit board 100 by, for example, a solder ball(s) 200s. The semiconductor chip 200 may be mounted on the circuit board 100 in form of, for example, a flip chip. The solder ball 200s attached to the semiconductor chip 200 may be connected to a through hole via (TSV) extending through the semiconductor chip 200.

The molding member 300 may completely surround the semiconductor chip 200 and one surface of the circuit board 100. The molding member 300 may include, for example, epoxy molding compound (EMC). The molding member 300 may be formed by, for example, a molded underfill (MUF) method.

Referring to FIG. 3, the thickness of the circuit board 100 is denoted by t1, the thickness of the semiconductor chip 200 is denoted by t2, and the thickness of the molding member 300 is denoted by t3. In the semiconductor package according to some embodiments of the present invention, the thickness t1 of the circuit board 100 may be in a range between 50 μm and 370 μm, for example. As the thickness of an electronic device using the semiconductor package is gradually decreasing, the thickness of the semiconductor package is generally also reduced. Therefore, the thickness d1 of the semiconductor chip 200, which may affect the thickness of the semiconductor package, is reduced, thereby reducing the thickness of the semiconductor package. In the semiconductor package according to some embodiments of the present invention, the thickness t2 of the semiconductor chip 200 may be in a range between 10 μm and 90 μm, for example, but aspects of the present invention are not limited thereto. In addition, in the semiconductor package according to embodiments of the present invention, the thickness t3 of the molding member 300 may be in a range between 10 μm and 150 μm, for example. However, if a plurality of semiconductor chips 200 are mounted on the circuit board 100, the thickness t3 of the molding member 300 may exceed 150 μm. That is to say, the invention does not limit the thickness t3 of the molding member 300 to 150 μm or less. In the semiconductor package according to some embodiments of the present invention, the top surface 200t of the semiconductor chip 200 may be exposed from the molding member 300. In addition, the top surface 200t of the semiconductor chip 200 and the top surface 300t of the molding member 300 may be at the same height level from the circuit board 100. In the semiconductor package according to embodiments of the present invention, the semiconductor chip 200 connected to the circuit board 100 by the solder ball 200s may be disposed by a flip chip bonding or a through hole via (TSV) method, for example. The top surface 200t of the semiconductor chip 200 disposed by a flip chip bonding or a through hole via (TSV) method, for example, may be covered by the molding member 300 and may not be exposed to the outside.

A modified example of the semiconductor package shown in FIG. 3 will now be described with reference to FIG. 4. As the semiconductor package 200 shown in FIG. 4 including semiconductor chip 200 is substantially the same as the semiconductor package shown in FIG. 3, except that it is connected to the circuit board 100 through a wiring, repeated portions will not be described or briefly described herein.

Referring to FIG. 4, in the semiconductor package 10, the semiconductor chip 200 is connected to the circuit board 100 through a wiring. The top surface 200t of the semiconductor chip 200 and the wiring are covered by the molding member 300. The thickness t3 of the molding member 300 is large enough to protect the wiring. As described in reference to FIG. 3, the thickness t2 of the semiconductor chip 200 may be in a range between 10 μm and 90 μm. However, the thickness t3 of the molding member 300 may be larger than the thickness t2 of the semiconductor chip 200 and less than or equal to 150 μm.

Referring to FIG. 5, an upper semiconductor package 20 according to other embodiments of the present invention is disposed on the semiconductor package 10. The upper semiconductor package 20 is electrically connected to the semiconductor package 10 by a conductive connection part 20s. A space may be formed between the semiconductor package 10 and the upper semiconductor package 20, but aspects of the present invention are not limited thereto. For example, when the top surface 200t of the semiconductor chip 200 is exposed, a space may exist between the top surface 200t of the semiconductor chip 200 and the upper semiconductor package 20.

Referring to FIG. 5, the upper semiconductor package 20 includes an upper substrate 20a, an upper semiconductor chip 20b and an upper molding member 20c. The upper substrate 20a is disposed on the molding member 300 and is connected to the circuit board 100 by the conductive connection part 20s. The upper substrate 20a may be the circuit board shown in FIG. 1, but aspects of the present invention are not limited thereto. The upper semiconductor chip 20b is disposed on a surface of the upper substrate 20a facing (opposite) a surface contacting the conductive connection part 20s. The upper semiconductor chip 20b may include a plurality of semiconductor chips. The upper semiconductor chip 20b may be, for example, a memory chip, a logic chip, or the like. The upper molding member 20c surrounds the upper semiconductor chip 20b and one surface of the upper substrate 20a. When the topmost semiconductor chip 20b2 among the plurality of upper semiconductor chips, for example, is electrically connected to the upper substrate 20a by a wiring, the top surface of the topmost semiconductor chip 20b2 is not exposed. However, when the topmost semiconductor chip 20b2 is not electrically connected to the upper substrate 20a by a wiring, the top surface of the topmost semiconductor chip 20b2 may be exposed.

Figure 6:
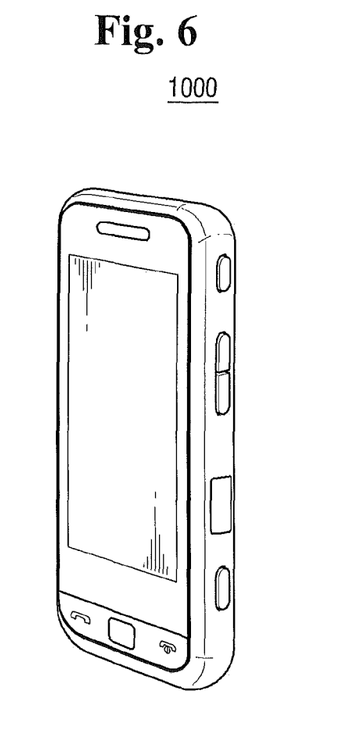
FIG. 6 is a perspective view illustrating an application example of a semiconductor package according to some embodiments of the present invention.

FIG. 6 is a perspective view illustrating an application example of a semiconductor package according to some embodiments of the present invention.

Referring to FIG. 6, the semiconductor package according to some embodiments of the present invention may be applied to an electronic device 1000 such as a cellular phone. As the semiconductor package according to some embodiments of the present invention is excellent in view of mechanical, electrical reliability, the operation reliability of the semiconductor package can be ensured even when the electronic device 1000 is used under severe conditions. The electronic device 1000 is not limited to the cellular phone shown in FIG. 6, but may include a variety of electronic devices, for example, a mobile electronic device, a notebook computer, a portable multimedia player (PMP), an MP3 player, a camcorder, a memory stick, a memory card and so on.

A method for fabricating a circuit board according to still other embodiments of the present invention will be described with reference to FIGS. 7 to 13. FIGS. 7 to 13 illustrate a method for fabricating a circuit board according to still other embodiments of the present invention.

The following description of the method for fabricating a circuit board will focus on a method of forming a thin package. While a conductive pattern and an insulation film are stacked in one direction in the illustrated embodiment, they may also be stacked in opposite directions.

Figure 7:
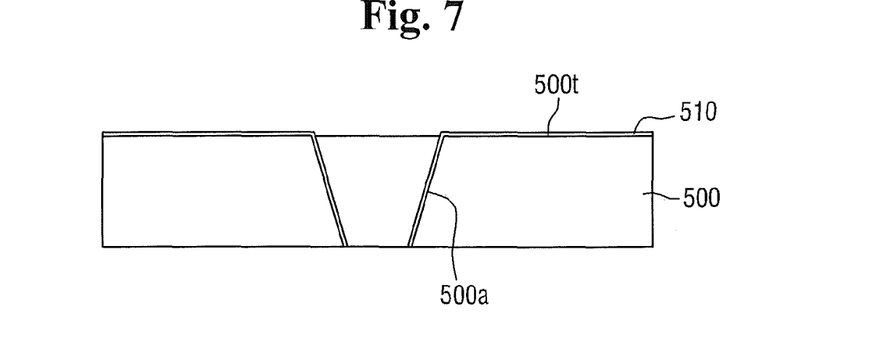
FIGS. 7 to 13 are cross sectional schematic diagrams that illustrate a method for fabricating a circuit board according to further embodiments of the present invention.

Referring to FIG. 7, a first insulation film 500 having a first via hole 500*a* is provided. The first insulation film 500 may be, for example, a core insulation film of the circuit board or an interlayer insulation film interposed between conductive patterns. The first insulation film 500 may be, for example, prepreg having an epoxy resin or acrylate impregnated in a mesh-type reinforce fiber. The first insulation film 500 may further include, for example, ceramic powder or glass filler. The first via hole 500*a* may be a through hole extending through the first insulation film 500. The first via hole 500*a* is shown as tapered, but aspects of the present invention are not limited thereto. The first via hole 500*a* may be formed of, for example, laser drilling.

Referring to FIG. 7, a first seed layer 510 is formed on the first via hole 500*a* and a top surface 500*t* of the first insulation film 500. For example, the first seed layer 510 may be formed by uniformly forming a conductive film on the first via hole 500*a* and the top surface 500*t* of the first insulation film 500. The first seed layer 510 may be made of, for example, copper or copper containing material. The first seed layer 510 may be formed by, for example, electroless plating, but aspects of the present invention are not limited thereto.

Figure 8:
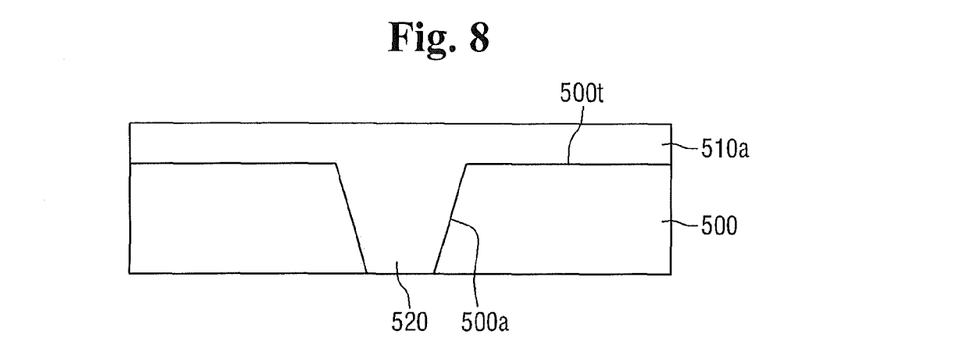

Referring to FIG. 8, the first via hole 500*a* is filled to form a first via 520. The first via hole 500*a* is filled with a conductive material, for example, copper or copper containing material to form the first via 520. The first via 520 may be formed by, for example, electroless plating. When the first via hole 500*a* is filled to form the first via 520, a conductive film 510*a* covering the top surface 500*t* of the first insulation film 500 is also formed. This is achieved because the first seed layer 510 is formed on not only the first via hole 500*a* but also the top surface 500*t* of the first insulation film 500. The conductive film 510*a* may be formed until the conductive film on the first via 520 is planarized, but aspects of the present invention are not limited thereto.

Figure 9:
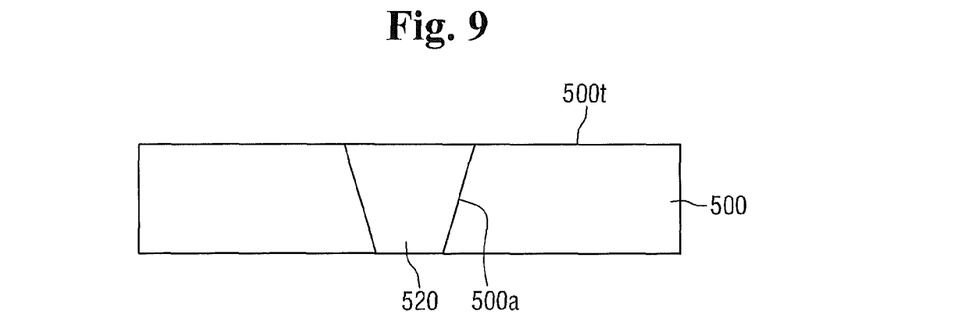

Referring to FIG. 9, the conductive film 510*a* formed on the first via 520 and the top surface 500*t* of the first insulation film 500 is removed, thereby exposing the top surface 500*t* of the first insulation film 500. The removing of the conductive film 510*a* may be achieved by, for example, chemical mechanical polishing (CMP) or spraying of a chemical etchant. For example, when the conductive film 510*a* containing copper is removed by spraying a chemical etchant, the chemical etchant may include, but not limited to, sulfuric peroxide.

Figure 10:
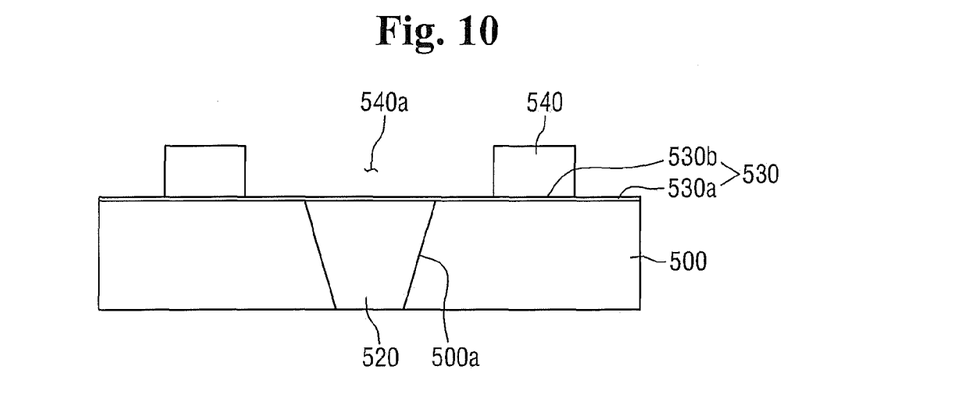

Referring to FIG. 10, a second seed layer 530 is formed on the top surface 500*t* of the first insulation film 500 and the first via 520. The second seed layer 530 may be made of, for example, copper or copper containing material. The second seed layer 530 may be formed by, for example, electroless plating, but aspects of the present invention are not limited thereto.

Referring to FIG. 10, a photoresist film pattern 540 is formed on the first insulation film 500 and the first via 520. That is to say, the photoresist film pattern 540 is formed on the second seed layer 530. The photoresist film pattern 540 includes an opening 540*a* formed on the first via 520. The second seed layer 530 is not formed on the photoresist film pattern 540. Therefore, when a conductive pattern is to be formed later by, for example, electroless plating, it is formed only on an exposed portion 530*a* of the second seed layer 530.

Figure 11:
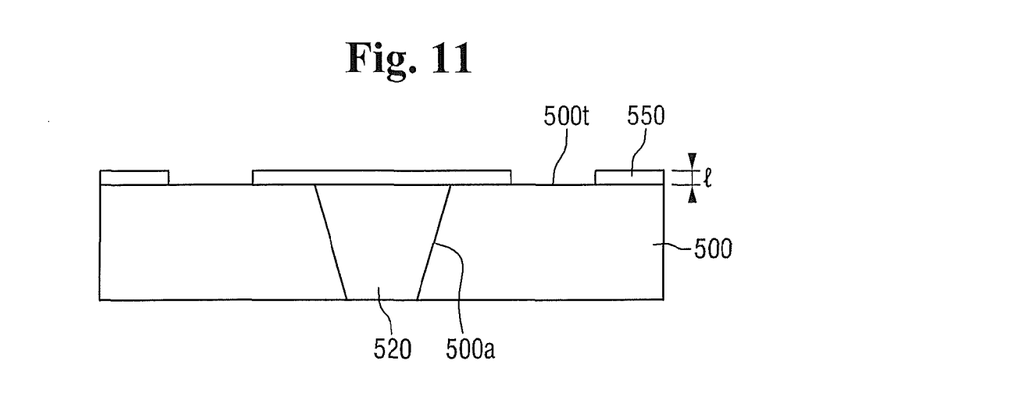

Referring to FIG. 11, a conductive patterns 550 is formed on the first insulation film 500. After a photoresist film pattern (540 of FIG. 10) is formed, the conductive pattern 550 is formed. The conductive pattern 550 may be made of, for example, copper or copper containing material. The second seed layer 530 may be formed by, for example, electroless plating. In FIG. 10, the conductive pattern 550 is formed on a portion 530*a* of the second seed layer 530 not overlapping with the photoresist film pattern but is not formed on a portion 530*b* of the second seed layer 530 overlapping with the photoresist film pattern. The photoresist film pattern 540 limits or even prevents the conductive pattern from being formed on the portion 530*b* of the second seed layer 530 overlapping with the photoresist film pattern.

A thickness of the conductive pattern 550 is smaller than a thickness of the conductive film 510*a* shown in FIG. 8.

Referring to FIGS. 10 and 11, the photoresist film pattern 540 on the first insulation film 500 is removed. After the photoresist film pattern 540 is removed, the conductive pattern 550 and the second seed layer 530 are formed on the entire surface of the first insulation film 500. Thereafter, the portion 530*b* of the second seed layer 530 overlapping with the photoresist film pattern is removed. If portion 530*b* of the second seed layer 530 overlapping with the photoresist film pattern is not removed, the conductive pattern 550 is entirely electrically connected, thereby making it difficult to achieve circuit construction. When the second seed layer 530 includes, for example, copper, the removing of the portion 530*b* of the second seed layer 530 overlapping with the photoresist film pattern may be achieved by, for example, sulfuric peroxide.

Figure 12:
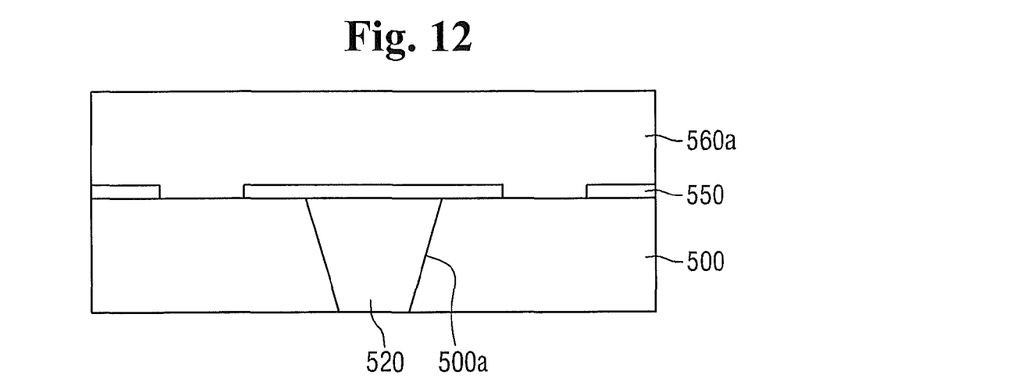

Referring to FIG. 12, a pre-insulation film 560*a* is formed on the conductive pattern 550. The pre-insulation film 560*a* may be, for example, prepreg having an epoxy resin or acrylate impregnated in a mesh-type reinforce fiber. The pre-insulation film 560*a* is formed on the conductive pattern 550 by, for example, lamination using heat compression, rolling, or dipping.

Figure 13:
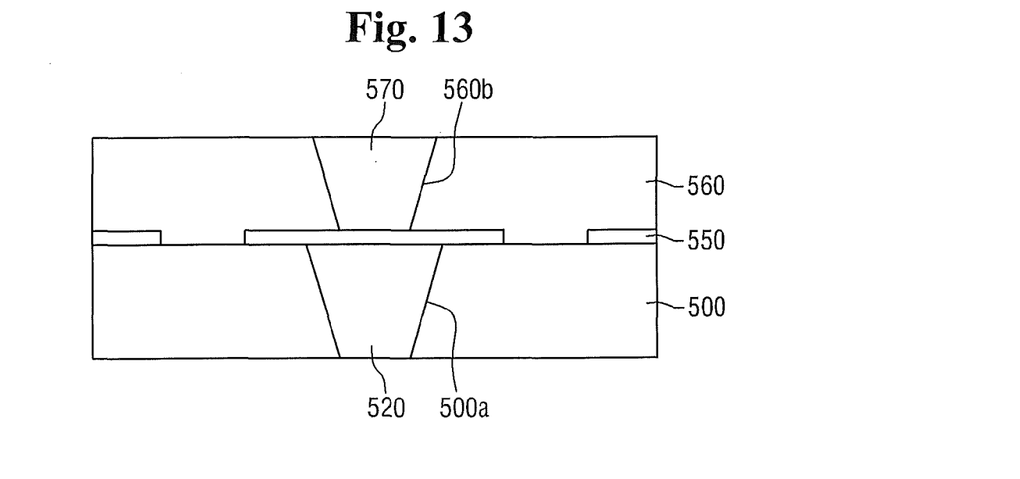

Referring to FIG. 13, a second via hole 560*b* is formed in the pre-insulation film 560*a*. In other words, a second insulation film 560 having the second via hole 560*b* is formed on the conductive pattern 550. Thereafter, the second via hole 560*b* is filled with a conductive material, for example, copper or a copper containing material, to form a second via 570. FIG. 13 shows that the second via 570 is formed on the first via 520, but aspects of the present invention are not limited thereto. The circuit board including a plurality of layers of conductive patterns can be fabricated by repeatedly performing the processes shown in FIGS. 7 to 13.

As described above, embodiments of the present invention provide a circuit board having a low coefficient of thermal expansion (CTE) by reducing a thickness of a conductive pattern included in the circuit board and defining a ratio of a circuit board thickness to the conductive pattern thickness. Embodiments of the present invention also provide a semiconductor package which can solve a warpage problem of the semiconductor package using the circuit board. Embodiments of the present invention also provide a method for fabricating a circuit board, by which a thickness of a conductive pattern can be reduced.

According to an aspect of the present invention, there is provided a circuit board that includes a core insulation film of a thickness A including a first surface and a second surface facing each other, an upper stack structure of a thickness B having an upper conductive pattern and an upper insulation film in sequence repeatedly stacked on the first surface of the core insulation film, and a lower stack structure of a thickness C having a lower conductive pattern and a lower insulation film in sequence repeatedly stacked on the second surface of the core insulation film, wherein a ratio of a sum of thicknesses of the upper conductive pattern and the lower conductive pattern to a sum (A+B+C) of thicknesses of the core insulation film, the upper stack structure and the lower stack structure is in a range of 0.1 to 0.25, and a ratio of the thickness A of the core insulation film to the sum (A+B+C) is in a range of 0.5 to 0.75.

According to another aspect of the present invention, there is provided a semiconductor package including a core insulation film of a thickness A including a first surface and a second surface facing each other, an upper stack structure of a thickness B having an upper conductive pattern and an upper insulation film in sequence repeatedly stacked on the first surface of the core insulation film, and a lower stack structure of a thickness C having a lower conductive pattern and a lower insulation film in sequence repeatedly stacked on the second surface of the core insulation film, a semiconductor chip disposed on the circuit board, and a molding member surrounding the semiconductor chip, wherein a ratio of a sum of thicknesses of the upper conductive pattern and the lower conductive pattern to a sum (A+B+C) of thicknesses of the core insulation film, the upper stack structure and the lower stack structure is in a range of 0.1 to 0.25, and a ratio of the thickness A of the core insulation film to the sum (A+B+C) is in a range of 0.5 to 0.75.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A circuit board comprising:
   a core insulation film having a thickness and including a first surface and an opposite second surface;
   an upper stack structure having a thickness and having an upper conductive pattern having a thickness and an overlying upper insulation film stacked on the first surface of the core insulation film; and
   a lower stack structure having a thickness and having a lower conductive pattern having a thickness and an overlying lower insulation film stacked on the second surface of the core insulation film, wherein a ratio P of a sum of the thicknesses of the upper conductive pattern and the lower conductive pattern to a sum of the thicknesses of the core insulation film, the upper stack structure and the lower stack structure is in a range from about 0.05 to about 0.25.

2. The circuit board of claim 1, wherein the upper conductive pattern and the upper insulation film comprise a plurality of layers sequentially and repeatedly stacked on the first surface and the lower conductive pattern and the lower insulation film comprise a plurality of layers sequentially and repeatedly stacked on the second surface and wherein the ratio P is in a range from about 0.1 to about 0.25 and wherein a ratio of the thickness of the core insulation film to the sum of the thicknesses of the core insulation film, the upper stack structure and the lower stack structure is in a range from about 0.5 to about 0.75.

3. The circuit board of claim 2, wherein the thickness of the upper conductive pattern is substantially the same as the thickness of the lower conductive pattern.

4. The circuit board of claim 3, wherein a thickness of each of the layers of the upper conductive pattern and a thickness of each of the layers of the lower conductive pattern is substantially the same.

5. The circuit board of claim 2, wherein a ratio of a sum of thicknesses of the upper insulation film layers, lower insulation film layers and the core insulation film to the a sum of the thicknesses of the core insulation film, the upper stack structure and the lower stack structure is in a range from about 0.75 to about 0.9.

6. The circuit board of claim 2, wherein a ratio of a sum of thicknesses of the upper insulation film layers and the lower insulation film layers to the a sum of the thicknesses of the core insulation film, the upper stack structure and the lower stack structure is in a range from about 0.15 to about 0.25.

7. The circuit board of claim 2, wherein the thickness of the circuit board is between 50 μm and 370 μm.

8. A semiconductor package including the circuit board of claim 2 and further comprising:
   a semiconductor chip disposed on the circuit board; and
   a molding member surrounding the semiconductor chip.

9. The semiconductor package of claim 8, wherein a thickness of the molding member is between 10 μm and 150 μm and a thickness of the semiconductor chip is between 10 μm and 90 μm.

10. The semiconductor package of claim 9, wherein the semiconductor chip is connected to the circuit board by flip chip bonding.

11. The semiconductor package of claim 8, wherein a top surface of the semiconductor chip is exposed from the molding member.

12. The semiconductor package of claim 8, further comprising:
   an upper substrate disposed on the molding member to be connected to the circuit board;
   an upper semiconductor chip disposed on the upper substrate; and
   an upper semiconductor package including an upper molding member surrounding the upper semiconductor chip.

13. A circuit board comprising:
   a core insulation film of a thickness A including a first surface and a second surface facing each other;

an upper stack structure of a thickness B having an upper conductive pattern and an upper insulation film in sequence repeatedly stacked on the first surface of the core insulation film; and a lower stack structure of a thickness C having a lower conductive pattern and a lower insulation film in sequence repeatedly stacked on the second surface of the core insulation film, wherein a ratio of a sum of thicknesses of the upper conductive pattern and the lower conductive pattern to a sum (A+B+C) of thicknesses of the core insulation film, the upper stack structure and the lower stack structure is in a range of 0.1 to 0.25, and a ratio of the thickness A of the core insulation film to the sum (A+B+C) is in a range of 0.5 to 0.75.

14. The circuit board of claim 13, wherein the sum of thicknesses of the core insulation film, the upper insulation film and the lower insulation film is 3 to 9 times the sum of the thicknesses of the upper and lower conductive patterns.

15. The circuit board of claim 13, wherein the thickness of the upper conductive pattern is equal to the thickness of the lower conductive pattern.

16. The circuit board of claim 13, wherein a number of stacks in the upper stack structure is equal to that of stacks in the lower stack structure.

17. The circuit board of claim 13, wherein the upper stack structure includes a first upper conductive pattern formed on the first surface of the core insulation film, a first upper insulation film formed on the first upper conductive pattern, a second upper conductive pattern formed on the first upper insulation film, and a stack via for connecting the first upper conductive pattern with the second upper conductive pattern.

18. The circuit board of claim 17, wherein the stack via, the upper conductive pattern and the lower conductive pattern include copper (Cu).

* * * * *